(12) United States Patent
Kim

(10) Patent No.: US 8,415,676 B2
(45) Date of Patent: Apr. 9, 2013

(54) ORGANIC LIGHT EMITTING DISPLAY

(75) Inventor: Eun-Ah Kim, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 1258 days.

(21) Appl. No.: 11/731,966

(22) Filed: Apr. 2, 2007

(65) Prior Publication Data

US 2008/0055212 A1    Mar. 6, 2008

(30) Foreign Application Priority Data

Aug. 31, 2006 (KR) .................. 10-2006-0083527

(51) Int. Cl.
*H01L 29/04* (2006.01)
*H01L 31/036* (2006.01)

(52) U.S. Cl. .......................... 257/72; 257/432

(58) Field of Classification Search ........... 257/58–72, 257/431–448, E29.273, E31.003
See application file for complete search history.

(56) References Cited

U.S. PATENT DOCUMENTS

| | | | | |
|---|---|---|---|---|
| 2004/0079941 A1* | 4/2004 | Yamazaki et al. | ............... | 257/40 |
| 2005/0110023 A1* | 5/2005 | Lee et al. | ............... | 257/72 |
| 2005/0116232 A1 | 6/2005 | Kim et al. | | |
| 2006/0011980 A1* | 1/2006 | Kim | ............... | 257/347 |
| 2006/0044504 A1 | 3/2006 | Yamada et al. | | |

FOREIGN PATENT DOCUMENTS

| | | |
|---|---|---|
| CN | 1622716 A | 6/2005 |
| CN | 1638564 A | 7/2005 |
| CN | 1743926 | 3/2006 |
| JP | 2002-258315 A | 9/2002 |
| JP | 2005-011571 A | 1/2005 |
| JP | 2005-109223 A | 4/2005 |
| JP | 2006-208903 A | 8/2006 |
| KR | 10-2003-0081991 A | 10/2003 |
| KR | 10-2005-0052026 A | 6/2005 |
| KR | 10-2006-0024234 A | 3/2006 |
| KR | 10-2006-0050847 A | 5/2006 |
| KR | 10-2007-0003178 A | 1/2007 |

* cited by examiner

*Primary Examiner* — Cuong Q Nguyen
(74) *Attorney, Agent, or Firm* — Knobbe, Martens, Olson & Bear LLP

(57) ABSTRACT

An organic light emitting display is provided. In the organic light emitting display, when a wiring section including a plurality of signal lines for transmitting signals to a driving circuit unit or an organic light emitting device is formed under a non-display region, more specifically, a COG region where a driving IC is mounted, the signal lines of the wiring section are disposed on two or more different layers to maintain a height difference between neighboring signal lines for transmitting different signals from each other.

14 Claims, 2 Drawing Sheets

ORGANIC LIGHT EMITTING DISPLAY

CROSS-REFERENCE TO RELATED APPLICATION

This application claims priority to and the benefit of Korean Patent Application No. 10-2006-0083527 filed in the Korean Intellectual Property Office on Aug. 31, 2006, the entire content of which is incorporated herein by reference.

BACKGROUND OF THE INVENTION

1. Field

The present invention relates to an organic light emitting display, and more particularly, to an organic light emitting display in which signal lines disposed under a non-display region located out of a display region where an image is displayed, more specifically, a chip on glass (COG) region are prevented from being shorted.

2. Description of the Related Art

Recently, various flat displays capable of reducing weight and volume compare to cathode ray tube (CRT) displays are being developed.

The flat display devices include a liquid crystal display (LCD), a field emission display (FED), a plasma display panel (PDP), an organic light emitting display (OLED), and the like.

The organic light emitting display displays an image by driving N×M organic light emitting devices, which are emissive display elements for electrically exciting an organic compound to emit light, by using a voltage or current.

Since the organic light emitting device has diode characteristics, the organic light emitting device is also referred to as an organic light emitting diode. The organic light emitting device includes an anode electrode that is a hole injection electrode, an organic thin film that is a light emitting layer, and a cathode electrode that is an electron injection electrode.

Accordingly, when holes and electrons are injected into the organic thin film, exitons obtained by combining the injected holes and electrons are transitioned from an excited state to a ground state, light is emitted from the organic light emitting device.

The OLEDs including the organic light emitting device having the aforementioned structure can be classified into a passive matrix type OLED and an active matrix type OLED depending upon driving types.

The structure of the active matrix type OLED will be described in detail.

The active matrix type OLED includes a first substrate provided with organic light emitting devices.

Here, the first substrate may be a driving circuit substrate including a driving circuit unit provided with TFTs.

The first substrate may be a display substrate not provided with the driving circuit unit, hereinafter, it is assumed that the first substrate is the driving circuit substrate.

The first substrate includes a display region, which is provided with organic light emitting devices, for displaying a predetermined image and a non-display region located out of the display region.

The display region is provided with a lower structure. A flattening layer is formed on the lower structure.

Here, the lower structure includes a plurality of thin film transistors and an interlayer insulation film for insulating the gate electrodes of the thin film transistors from the source and drain electrodes thereof.

In addition, an anode electrode electrically connected to the source and/or drain electrodes is formed on the flattening layer. The light emitting layer and a cathode electrode are sequentially formed on the anode electrode.

The organic light emitting device including the anode electrode, the light emitting layer, and the cathode electrode is separated from a neighboring sub-pixel by using a pixel defining layer.

At this time, the sub-pixel includes the light emitting layer for emitting red, green, or blue light.

Accordingly, a single pixel includes three sub-pixels for emitting light of each color of R, G and B. Full colors can be displayed by using a plurality of pixel.

The aforementioned organic light emitting display includes one or more driving ICs.

The driving ICs may be generally mounted by a tape automated bonding (TAB) or chip on glass (COG) method.

Here, the TAB method is a technique of mounting a tape carrier package (TCP) in which the driving IC is mounted on the substrate, and the COG method is a technique of directly mounting the driving IC on the substrate.

In the COG method, a driving IC having a finer pitch can be mounted as compared with a pitch used for the TAB method. Accordingly, recently, the COG method has been widely used.

However, to apply the COG method, the COG region on which the driving IC is mounted has to be included on the substrate. In the past, a part of the non-display region disposed out of the display region is used as the COG region.

Recently, a multi-panel process has been used to manufacture the organic light emitting display having the aforementioned structure.

Here, in the multi-panel process, a plurality of organic light emitting displays are formed on a mother glass, all the organic light emitting displays are enclosed by using encapsulation glass, and the encapsulation glass and the mother glass are cut in units of displays to provide a plurality of displays.

When the COG type organic light emitting display is manufactured in the multi-panel process, a part of the encapsulation glass is scribed and removed to expose the COG region, and the driving IC is mounted on the exposed COG region.

However, when the part of the encapsulation glass is removed, the flattening film is scratched by glass particles generated in the scribing process.

Accordingly, wirings under the COG region, which are formed on the same layer as the source and drain electrodes of the thin film transistor and protected by the flattening film, are shorted in the process of fabrication.

SUMMARY

The present invention provides an organic light emitting display capable of preventing wires disposed on a non-display region from being shorted.

An organic light emitting display device comprises: a first substrate comprising a top surface; a second substrate; an array of organic light emitting pixels; a thin film transistor; and a plurality of conductive lines. The array of organic light emitting pixels is interposed between the first substrate and the second substrate. The thin film transistor is interposed between the first substrate and the array of organic light emitting pixels, and the thin film transistor comprises a semiconductor layer, a gate electrode, source and drain electrodes, a first insulation film, and a second insulation film. The plurality of conductive lines comprise first conductive lines and second conductive lines, and the first conductive lines are formed on the first insulation film and the second conductive lines are formed on the second insulation film. The first and second conductive lines are substantially parallel to one another and not overlapping when viewed in a direction substantially perpendicular to the top surface. Each of the first and second insulation films comprises one selected from the group consisting a gate insulation film and an interlayer insulation film.

The device may further comprises a chip on glass (COG) region which does not overlap the array of organic light emitting pixels to a direction substantially perpendicular to the top surface, and the first and second conductive lines may be disposed in the COG region.

The gate insulation film is interposed between the semiconductor layer and the gate electrode, and the interlayer insulation film is interposed between the gate electrode and the source and drain electrodes.

The first insulation film comprises the gate insulation film. The gate insulation film comprises a first extension, and the first conductive lines are interposed between the first extension of the gate insulation film and the interlayer insulation film. The first conductive lines may be made of a same material as the gate electrode.

The second insulation film comprises the interlayer insulation film. The interlayer insulation film comprises a second extension, and the second conductive lines are interposed between the second extension of the interlayer insulation layer and the array of organic light emitting pixels. The second conductive lines may be made of a same material as the source and drain electrodes.

The first conductive lines and the second conductive lines are disposed in an alternating order along a direction substantially parallel to the top surface.

The array of organic light emitting pixels defines a display region confined by the first and second substrates along a first direction substantially perpendicular to the top surface and by a perimeter surface along a second direction substantially parallel to the top surface, and the perimeter surface is extended between the first and second substrate and perpendicular to the top surface.

The array of organic light emitting pixels may be provided in the display region, and wherein the thin film transistor is provided in the display region. The wiring section is provided in a non-display region. The non-display region comprises a region between the first and second substrates, and the non-display region encloses the perimeter surface of the display region.

The non-display region may further comprise a chip on glass (COG) region, and the plurality of conductive lines may be formed under the COG region.

Different signals may be transmitted through the first conductive lines. Same signals may be transmitted through the first conductive lines. Or, signals transmitted through the first conductive lines are different from signals transmitted through the second conductive lines.

Alternatively, the thin film transistor interposed between the first substrate and the array of organic light emitting pixels, and the thin film transistor comprises a semiconductor layer, a gate electrode, source and drain electrodes, a gate insulation film interposed between the semiconductor layer and the gate electrode, and an interlayer insulation film interposed between the gate electrode and the source and drain electrodes, wherein the gate insulation film comprise a first extension and the interlayer insulation film comprises a second extension. The plurality of conductive lines are formed on the first extension of the gate insulation film, and the first extension is extended from the gate insulation film of the thin film transistor.

The plurality of conductive lines are interposed between the first extension of the gate insulation film and the second extension of the interlayer insulation layer. The plurality of conductive lines may be made of a same material as the gate electrode.

The plurality of conductive lines may comprise first conductive lines and second conductive lines. Different signals may be transmitted through the first conductive lines. Same signals may be transmitted through the first conductive lines. Or signals transmitted through the first conductive lines may be different from signals transmitted through the second conductive lines. The first and second conductive lines may be for transmitting signals to the thin film transistor.

An organic light emitting display device may be fabricated by a method comprising: forming the semiconductor layer on the first substrate; forming the gate insulation film on the semiconductor layer; forming the gate electrode and the first conductive lines on the gate insulation film; forming the interlayer insulation film on the gate electrode and the first conductive lines; forming the source and drain electrodes and the second conductive lines on the interlayer insulation film; forming a flattening layer on the source and drain electrodes and the second conductive lines; and forming the array of organic light emitting pixels on the flattening layer. The first conductive lines are made of the same material as the gate electrode and the second conductive lines are made of the same material as the source and drain electrodes.

According to an aspect of the present invention, there is provided an organic light emitting display in which when a wiring section including a plurality of signal lines for transmitting signals to a driving circuit unit or an organic light emitting device is formed under a non-display region, more specifically, a COG region where a driving IC is mounted, the signal lines transmitting different signal from each other are disposed on two or more different layers to maintain a height difference between neighboring signal lines.

In the above aspect of the present invention, the signal lines may be disposed on a gate insulation film and an interlayer insulation film.

The gate insulation film located between a semiconductor layer of a thin film transistor and a gate electrode of the thin film transistor, and the interlayer insulation film located between source and drain electrodes of the thin film transistor and the gate electrode.

First signal lines formed on the gate insulation film may be made of the same material as the gate electrode.

Second signal lines may be formed on the interlayer insulation film and may be made of the same material as the source and drain electrodes of the thin film transistor.

Different signals may be transmitted through the first and second signal lines, respectively.

In addition, the same signals may be transmitted through the first signal lines, and similarly, the same signals may be transmitted through the second signal lines.

Alternatively, different signals may be transmitted through the first signal lines.

The first and second signal lines are alternately disposed, and all the signal lines on the wiring section, which is made of the same material as the gate electrode, are formed on the gate insulation film.

In the organic light emitting display having the aforementioned structure, the signal lines are prevented from being shorted. Accordingly, serious errors are prevented from occurring in driving the organic light emitting devices.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1:
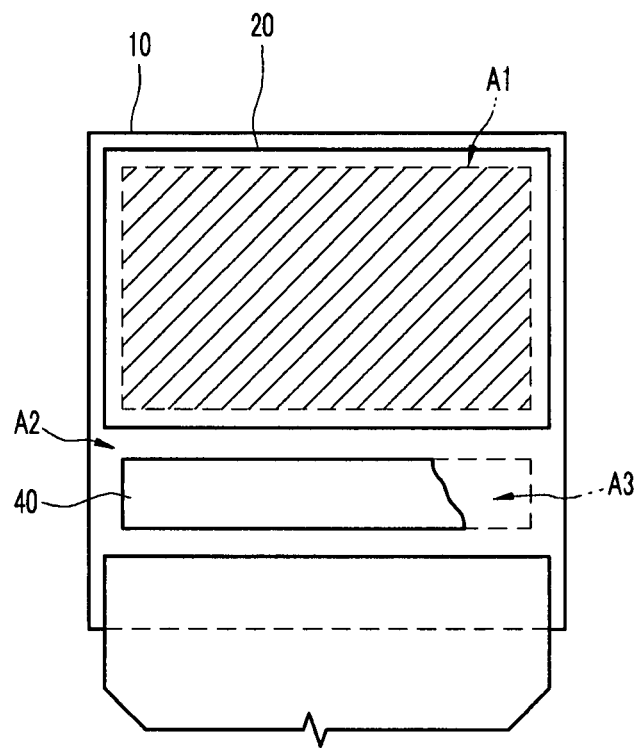
FIG. 1 is a top plan view illustrating a schematic structure of an organic light emitting display according to an embodiment of the present invention.

The present invention will now be described more fully hereinafter with reference to the accompanying drawings, in which preferred embodiments of the invention are shown. As those skilled in the art would realize, the described embodiments may be modified in various different ways, all without departing from the spirit or scope of the present invention.

Like reference numerals designate like elements throughout the specification.

In the drawings, the thickness of layers, films, panels, regions, etc. are exaggerated for clarity. It will be understood that when an element such as a layer, film, region or substrate is referred to as being "on" another element, it can be directly on the other element or intervening elements may also be present.

In contrast, when an element is referred to as being "directly on" another element, there are no intervening elements present.

Figure 2:
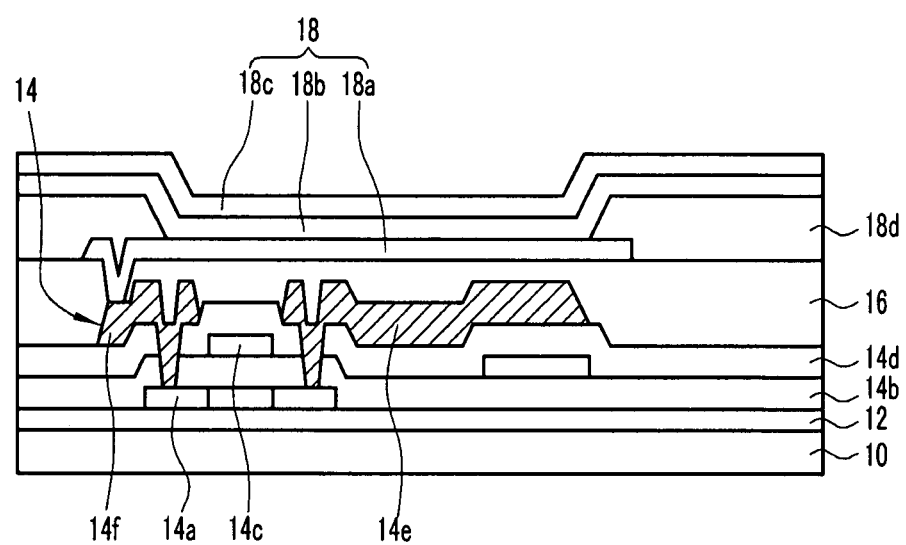
FIG. 2 is a cross-sectional view illustrating a schematic structure of a display region shown in FIG. 1.

FIG. 1 is a top plan view illustrating a schematic structure of an organic light emitting display according to an embodiment of the present invention, and FIG. 2 is a cross-sectional view illustrating a schematic structure of a display region shown in FIG. 1.

Figure 3:
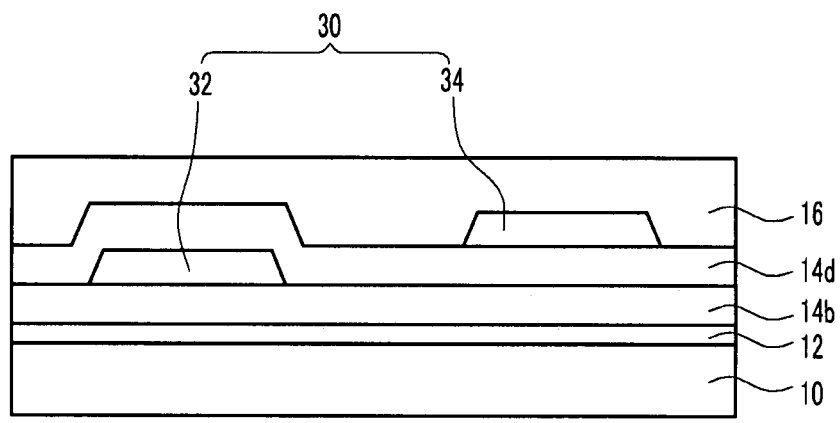
FIG. 3 is a cross-sectional view illustrating a schematic structure of a wiring section disposed under a non-display region shown in FIG. 1, more specifically, COG region.
Figure 4:
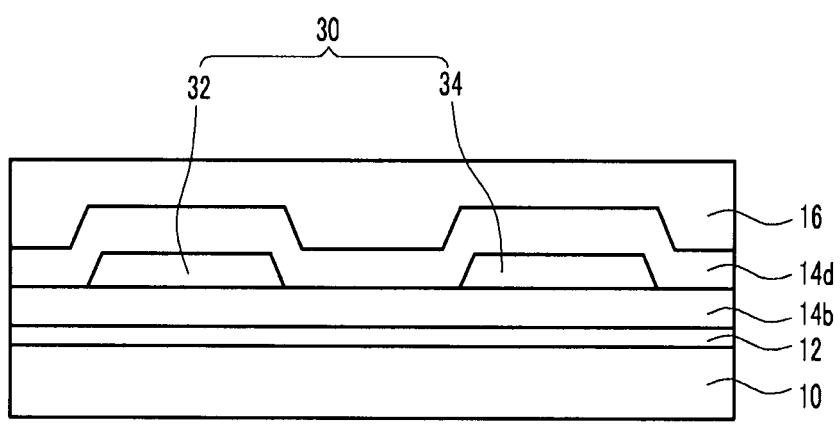
FIG. 4 is a cross-sectional view illustrating a schematic structure of a wiring section according to another embodiment of the present invention.

FIG. 3 is a cross-sectional view illustrating a schematic structure of a wiring section disposed under a non-display region shown in FIG. 1, more specifically, COG region, and FIG. 4 is a cross-sectional view illustrating a schematic structure of a wiring section according to another embodiment of the present invention.

As shown in FIG. 1, the organic light emitting display according to an embodiment of the present invention includes first and second substrates 10 and 20 facing each other.

Here, the first substrate 10 may be made of transparent glass, opaque resin, or metal foil.

The second substrate 20 enclosed in the first substrate 10 by using a sealant may be made of transparent glass or metal cap.

The aforementioned structure may be sealed by coating the structure of the first substrate 10 with a thin film.

The first substrate 10 includes a display region A1 and a non-display region A2. The display region A1 is provided with a plurality of organic light emitting devices 18 for displaying a predetermined image.

Hereinafter, referring to FIG. 2, a cross sectional structure of the display region A1 is described.

FIG. 2 is a cross-sectional view illustrating an active matrix type organic light emitting display serving as a bottom emission type device. A buffer film 12 is formed on the first substrate 10, and thin film transistors 14 constituting a driving circuit unit are formed on the buffer film 12.

More specifically, a semiconductor layer 14a is formed on the buffer layer 12, and a gate insulation film 14b is formed on the semiconductor layer 14a and the buffer layer 12.

Here, the semiconductor 14a is formed by patterning a polycrystalline silicon film into a predetermined shape and injecting impurities into the polycrystalline silicon film to form source and drain regions and a channel region interposed therebetween.

A gate electrode 14c is formed on the gate insulation film 14b, an interlayer insulation film 14d is formed on the gate electrode 14c and the gate insulation film 14b, and source and drain electrodes 14e and 14f are formed on the interlayer insulation film 14d.

At this time, the source and drain electrodes 14e and 14f are electrically connected to the source and drain regions of the semiconductor layer 14a, respectively, through a connection hole of the interlayer insulation film 14d.

A flattening layer 16 is formed on the thin film transistor 14 and the interlayer insulation film 14d, and an organic light emitting device 18 is formed on the flattening layer 16.

More specifically, an anode electrode 18a is formed on the flattening layer 16. The anode electrode 18a is electrically connected to the drain electrode 14f through a connection hole of the flattening layer 16. A light emitting layer 18b and a cathode electrode 18c are sequentially formed on the anode electrode 18a.

At this time, the anode electrode 18a may be made of a transparent conductive material such as ITO or IZO to display light emitted from the light emitting layer 18b to the outside of the organic light emitting devices 18 through the anode electrode 18a and the first substrate 10.

The organic light emitting devices 18 including the anode and cathode electrodes 18a and 18c and the light emitting layer 18b are separated from neighboring elements by a pixel defining layer 18d.

The light emitting layer 18b may be constructed as a multilayer structure including a hole injection layer, a hole transport layer, and an electron transport layer to display one color of red, green, and blue.

Although not shown, an electron injection layer (EIL) may be further formed between the electron transport layer and the cathode electrode 18c.

The organic light emitting devices 18 having the aforementioned structure display a predetermined image by allowing the light emitted from the light emitting layer 18b to pass through the anode electrode 18a and the first substrate 10 and to be emitted to the outside of the organic light emitting devices 18.

A detailed structure of the aforementioned organic light emitting device and the thin film transistor may be changed according to a product specification.

The non-display region A2 disposed out of the display region A1 includes a wiring section 30 for supplying a driving signal to the thin film transistor 14 or organic light emitting device 18.

As shown in FIG. 3, the wiring section 30 includes a plurality of signal lines 32 and 34. The driving signal is transmitted through the signal lines 32 and 34.

However, recently, the signal lines 32 and 34, which are made of the same material as the source and drain electrodes 14e and 14f, are formed on the interlayer insulation film 16.

Accordingly, when the non-display region that is not enclosed by the second substrate 20, more specifically, a short circuit occurs between the signal lines 32 and 34 in the process of fabrication.

In the present embodiment, to prevent the short circuit between the signal lines 32 and 34, at least one signal line of the signal lines 32 and 34 is formed on the gate insulation film 14b.

More specifically, the wiring section 30 according to an embodiment of the present invention includes a first signal line 32 formed on the gate insulation film 14b and a second signal line 34 formed on the interlayer insulation film 14d.

Although one first signal line 32 and one second signal line 34 are shown in FIG. 3, a plurality of first signal lines 32 and a plurality of second signal lines 34 are formed under the COG region A3 in the same pattern as FIG. 3, in practice.

The first signal line 32 may be made of the same material as the gate electrode 14c. The second signal line 34 may be made of the same material as the source and drain electrodes 14e and 14f.

When the wiring section 30 having the aforementioned structure is formed, the first signal line 32 formed on the gate insulation film 14b and the second signal line 34 formed on the interlayer insulation film 14d may be alternately disposed.

That is, the first and second signal lines 32 and 34 may be disposed on different layers to maintain a height difference between the neighboring signal lines.

This is because the short circuit between the neighboring signal lines 32 and 34 is prevented.

The wiring section 30 having the aforementioned structure is constructed so that different signals are transmitted through the first and second signal lines 32 and 34, respectively.

In this case, the same signals or different signals may be transmitted through the aforementioned first signal lines 32, and the same signals may be transmitted through the second signal lines 34.

As is not shown, the first and second signal lines 32 and 34 need not be alternately formed one by one.

For example, two or more first signal lines 32 protected by the interlayer insulation film 14d may be formed between the second signal lines 32.

On the other hand, in another embodiment of the present invention, as shown in FIG. 4, all the signal lines constituting the wiring section 30, that is, the first and second signal lines 32 and 34 are made of the same material as the gate electrode 14c and formed on the gate insulation film 14b.

In the present embodiment, two or more different voltages are transmitted through the signal lines 32 and 34.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting display device comprising:
a first substrate comprising a top surface;
a second substrate;
an array of organic light emitting pixels interposed between the first substrate and the second substrate;
a thin film transistor interposed between the first substrate and the array of organic light emitting pixels, the thin film transistor comprising a semiconductor layer, a gate electrode, a source electrode and a drain electrode, a first insulation film, and a second insulation film, wherein each of the first and second insulation films comprises one selected from the group consisting a gate insulation film and an interlayer insulation film, and wherein the second insulation film is substantially parallel to and directly contacts the first insulation film; and
a plurality of conductive lines comprising first conductive lines and second conductive lines, wherein the first conductive lines are formed on the first insulation film and the second conductive lines are formed on the second insulation film, and wherein the first and second conductive lines are substantially parallel to and electrically insulated from each other.

2. The device of claim 1, further comprising a chip on glass (COG) region which does not overlap the array of organic light emitting pixels to a direction substantially perpendicular to the top surface, wherein the first and second conductive lines are disposed in the COG region.

3. The device of claim 1, wherein a portion of the gate insulation film is interposed between the semiconductor layer and the gate electrode, and wherein a portion of the interlayer insulation film is interposed between the gate electrode and the source or drain electrode.

4. The device of claim 3, wherein the first insulation film comprises the gate insulation film, wherein the gate insulation film comprises a first extension, and wherein the first conductive lines are interposed between the first extension of the gate insulation film and the interlayer insulation film.

5. The device of claim 4, wherein the first conductive lines are made of the same material as the gate electrode.

6. The device of claim 3, wherein the second insulation film comprises the interlayer insulation film, wherein the interlayer insulation film comprises a second extension, and wherein the second conductive lines are interposed between the second extension of the interlayer insulation layer and the array of organic light emitting pixels.

7. The device of claim 6, wherein the second conductive lines are made of the same material as the source and drain electrodes.

8. The device of claim 3, wherein the first conductive lines and the second conductive lines are disposed in an alternating order along a direction substantially parallel to the top surface.

9. The device of claim 1, wherein the array of organic light emitting pixels defines a display region confined by the first and second substrates along a first direction substantially perpendicular to the top surface and by a perimeter surface along a second direction substantially parallel to the top surface, wherein the perimeter surface is extended between the first and second substrate and perpendicular to the top surface.

10. The device of claim 9, wherein the array of organic light emitting pixels is provided in the display region, and wherein the thin film transistor is provided in the display region.

11. The device of claim 9, wherein the plurality of conductive lines are provided in a non-display region, wherein the non-display region comprises a region between the first and second substrates, and wherein the non-display region encloses the perimeter surface of the display region.

12. The device of claim 11, wherein the non-display region further comprises a chip on glass (COG) region, wherein the plurality of conductive lines are formed under the COG region.

13. The device of claim 1, wherein the first and second conductive lines are substantially parallel to one another and not overlapping when viewed in a direction substantially perpendicular to the top surface.

14. The device of claim 1, wherein the first and second conductive lines directly contact the first and second insulation films, respectively, and wherein the second insulating film is interposed between the first and second conductive lines.

* * * * *